United States Patent [19]
Mao

[11] Patent Number: 5,943,224
[45] Date of Patent: Aug. 24, 1999

[54] POST REGULATOR WITH ENERGY RECOVERY SNUBBER AND POWER SUPPLY EMPLOYING THE SAME

[75] Inventor: Hengchun Mao, Plano, Tex.

[73] Assignee: Lucent Technologies Inc., Murray Hill, N.J.

[21] Appl. No.: 09/055,815

[22] Filed: Apr. 6, 1998

[51] Int. Cl.⁶ ................................................. H02H 7/125
[52] U.S. Cl. ............................................. 363/52; 363/53
[58] Field of Search ................................. 363/50, 52, 53, 363/55, 56, 123, 125, 127

[56] References Cited

U.S. PATENT DOCUMENTS

| | | | |
|---|---|---|---|
| 4,977,493 | 12/1990 | Smith | 363/126 |
| 5,351,179 | 9/1994 | Tsai et al. | 363/53 |
| 5,414,613 | 5/1995 | Chen | 363/52 |
| 5,615,094 | 3/1997 | Cosentini et al. | 363/56 |
| 5,636,114 | 6/1997 | Bhagwat et al. | 363/56 |
| 5,731,966 | 3/1998 | Liu | 363/53 |

OTHER PUBLICATIONS

"Modelling and Design of Non–Dissipative LC Snubber Networks" by William J. Shaughnessy: Proceedings of Powercon 7. 1980; pp. G4–1 –G4–9.

"Design Techniques for Synchronous–Switch Post Regulators" by Cliff Jamerson and Tony Long: May 1993; pp. 10–20.

*Primary Examiner*—Matthew Nguyen

[57] ABSTRACT

For use with a post regulator for a power converter, the post regulator having a rectifier circuit and an output circuit, an energy recovery snubber, a method of operating the same and a power converter employing the snubber or the method. In one embodiment, the snubber includes: (1) a clamping diode and a clamping capacitor, series-coupled between the rectifier circuit and the output circuit, that cooperate to recover reverse recovery energy developed in the power converter to an output thereof and (2) a charge balancing circuit, coupled to the clamping capacitor, that maintains a charge balance of the clamping capacitor.

21 Claims, 4 Drawing Sheets

POST REGULATOR WITH ENERGY RECOVERY SNUBBER AND POWER SUPPLY EMPLOYING THE SAME

TECHNICAL FIELD OF THE INVENTION

The present invention is directed, in general, to power conversion and, more specifically, to a post regulator having an energy recovery snubber and a power supply that employs such regulator.

BACKGROUND OF THE INVENTION

Switch mode power converters (SMPC) that convert AC or DC input power into DC output(s) frequently have multiple outputs. These outputs are often derived from multiple secondary windings of a single power transformer. Alternatively, multiple power transformers may also be used. In SMPCs having a single power transformer, a primary winding of the power transformer is switched or commutated to an input voltage source by converter switches in such a way as to provide pulse trains at appropriate current and voltage levels on the secondary windings. The DC outputs are formed via rectification and subsequent filtering of the pulse trains. A voltage level of each DC output, therefore, depends on a turns ratio of each secondary winding to the primary winding as well as a duty cycle of the converter switches.

One DC output (usually called a "main output") may be directly regulated by a feedback circuit. The feedback circuit senses the main output and modifies a switching pattern of the converter switches to compensate for changes in either load or input voltage thereby maintaining the main output at a relatively constant voltage level. Many methods of direct feedback regulation are known in the art, including, for instance, pulse width modulation (PWM).

While direct feedback regulation is adequate for regulating the main output, the other DC outputs (auxiliary outputs) cannot be similarly regulated. Although direct feedback regulation of the main output provides some measure of regulation (cross-regulation) to the auxiliary outputs due to transformer coupling, in many cases the cross-regulation is inadequate. One technique, post-regulation, has been developed to allow regulation of the auxiliary outputs.

A conventional post regulator typically includes a rectifier, coupled to a secondary winding, that rectifies the pulse train generated by the primary side converter switches. A switch, series-coupled to the rectifier, then uses leading-edge modulation to regulate a pulse width of the pulse train. By blocking a portion of the pulse train, the switch may thus regulate a voltage level of the corresponding auxiliary output.

While leading-edge modulation provides adequate regulation of the auxiliary output, trailing-edge modulation is preferred. Trailing-edge modulation allows conventional low cost PWM devices to be used. Additionally, current-mode control, which enhances transient response and allows cycle-by-cycle current limitation, is possible with trailing-edge modulation. To achieve high efficiency operation with trailing-edge modulation, however, leakage energy from the secondary winding of the transformer must be recovered. Reverse-recovery energy of the rectifier must also be recovered to reduce power loss and noise emissions.

Accordingly, what is needed in the art is a system and method for recovering energy from the post regulator, thereby increasing an overall efficiency of the power converter.

SUMMARY OF THE INVENTION

To address the above-discussed deficiencies of the prior art, the present invention provides, for use with a post regulator for a power converter, the post regulator having a rectifier circuit and an output circuit, an energy recovery snubber, a method of operating the same and a power converter employing the snubber or the method. In one embodiment, the snubber includes: (1) a clamping diode and a clamping capacitor, series-coupled between the rectifier circuit and the output circuit, that cooperate to recover leakage inductance and reverse recovery energy developed in the power converter to an output thereof and (2) a charge balancing circuit, coupled to the clamping capacitor, that maintains a charge balance of the clamping capacitor.

The present invention therefore introduces the broad concept of recovering leakage inductance and reverse recovery energy through a series-coupled clamping diode and clamping capacitor for delivery to the output instead of dissipating the energy as occurs in conventional circuits.

In one embodiment of the present invention, the snubber is coupled to first and second rectifier diodes of the rectifier circuit. The first and second rectifier diodes may form a portion of a full wave rectifier. Alternatively, the diodes may form a portion of a half wave rectifier.

In one embodiment of the present invention, the post regulator further has a post regulating switch, series-coupled to the rectifier circuit, that switches to provide voltage regulation for the power converter. The post regulating switch may be trailing-edge, leading-edge or dual-edge modulated to provide proper output voltage regulation.

In one embodiment of the present invention, the output circuit has a freewheeling diode and an output capacitor coupled to the freewheeling diode. The output capacitor forms a portion of a filter employed to smooth the output voltage of the power converter.

In one embodiment of the present invention, the charge balancing circuit comprises a clamping resistor parallel-coupled across the clamping diode. In an alternative embodiment of the present invention, the charge balancing circuit comprises an inductor and a diode coupled to the clamping capacitor. The resistor provides charge balancing at the cost of some power dissipation. The inductor and diode cooperate to provide essentially nondissipative charge balancing for applications requiring particularly high efficiency.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
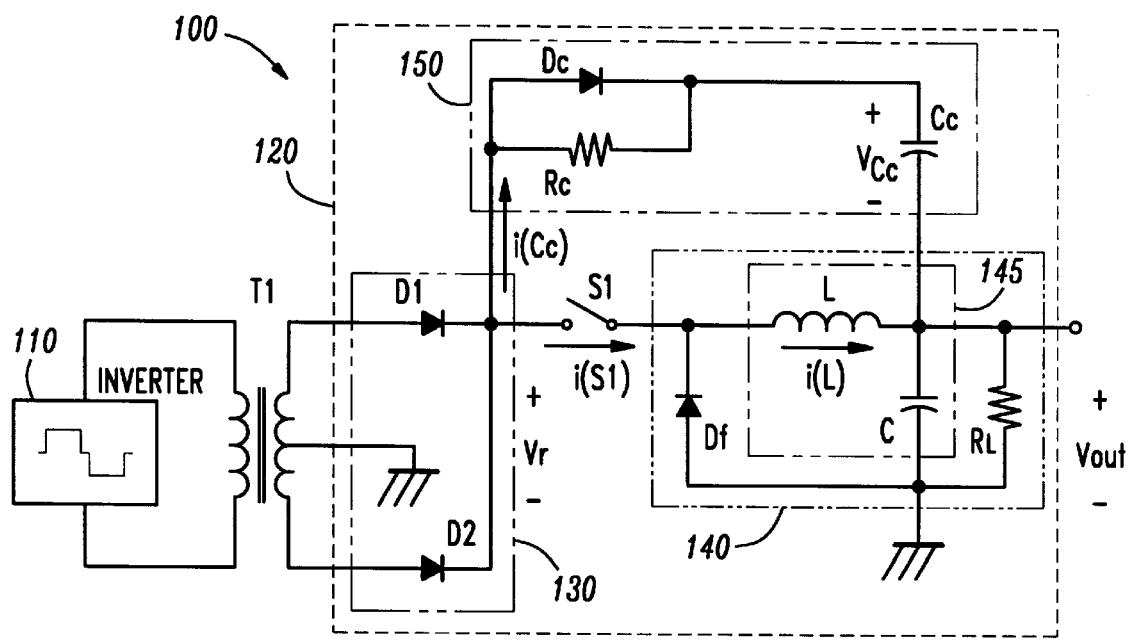
FIG. 1 illustrates a schematic diagram of an embodiment of a DC/DC power converter constructed according to the principles of the present invention.

Referring initially to FIG. 1, illustrated is a schematic diagram of an embodiment of a DC/DC power converter 100 constructed according to the principles of the present invention. While the illustrated embodiment contains only one output, those skilled in the art will realize that the power converter 100 may contain multiple outputs. In wireless base station telecommunication applications, for instance, a typical power converter 100 may contain ten outputs.

The power converter 100 includes a transformer T1 having primary and secondary windings (not individually referenced). The power converter 100 further includes an inverter 110 coupled to the primary winding of the transformer T1 and a post regulator 120 coupled to the secondary winding of the transformer T1. An output of the power converter 100 provides an output voltage Vout to a load (not shown). The inverter 110 is well known in the art and, as a result, will not be described in detail.

The post regulator 120 includes a rectifier circuit 130, including first and second rectifier diodes D1, D2, coupled to the secondary winding. The rectifier circuit 130 receives a pulse train from the inverter 110 and produces therefrom a rectified transformer voltage Vr. In the illustrated embodiment, the rectifier circuit 130 is a full wave rectifier. Of course, the use of a half-wave rectifier is also well within the broad scope of the present invention.

The post regulator 120 further includes a post regulating switch S1, series-coupled to the rectifier circuit 130. The switch S1 blocks or chops a portion of the rectified transformer voltage Vr to regulate the output voltage Vout. Although the switch will herein be described in terms of trailing-edge modulation, those skilled in the art will realize that the switch may also be controlled with other types of modulation, including, for instance, leading-edge modulation and double-edge modulation.

The post regulator 120 further includes an output circuit 140, consisting of a freewheeling diode Df, an output filter 145 (containing an output inductor L and an output capacitor C), and a load resistor Rl. The output circuit 140 is coupled between the switch S1 and the output of the power converter 100.

The post regulator 120 still further includes a snubber circuit 150 coupled between the rectifier circuit 130 and the output circuit 140. In the illustrated embodiment, the snubber circuit 150 contains a clamping diode Dc and clamping capacitor Cc, series-coupled between the rectifier circuit 130 and the output circuit 140. The snubber circuit 150 further contains a clamping resistor Rc, parallel-coupled to the clamping diode Dc. The operation of the post regulator 120 and the snubber circuit 150 will be described in greater detail by referring jointly to FIGS. 2A, 2B, and 2C, and with continuing reference to FIG. 1.

Figure 2:
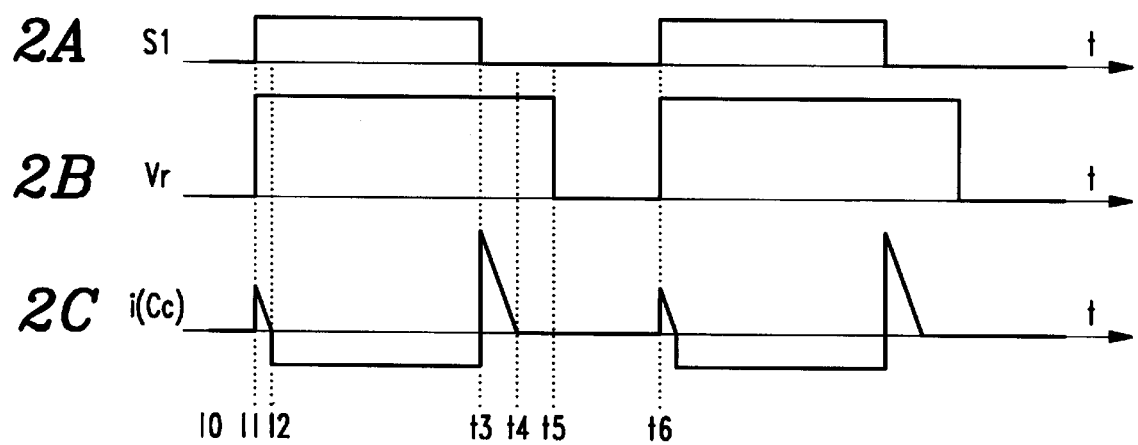
FIGS. 2A, 2B, and 2C illustrate voltage and current waveforms of the power converter of FIG. 1.

Turning now to FIGS. 2A, 2B, and 2C, illustrated are voltage and current waveforms of the power converter 100 of FIG. 1. More specifically, FIG. 2A represents a control signal of the switch S1. FIG. 2B represents the rectified transformer voltage Vr. FIG. 2C represents a clamping current I(Cc) through the snubber circuit 150.

The power converter 100 operates as follows. The inverter 110 switches to apply an input voltage to the transformer T1, thereby inducing a pulse train at an appropriate current and voltage level on the secondary winding. The rectifier circuit 130 rectifies the pulse train to produce therefrom the rectified transformer voltage Vr (see FIG. 2B). The switch S1 may then be modulated, via PWM, for instance, to block a portion of a trailing edge of the pulse train (see FIG. 2A).

At an initial time t0, before a turn-on of the switch S1, the freewheeling diode Df conducts a choke current I(L). The switch S1 may be turned on with substantially zero voltage, or with a reduced voltage, if it is turned on before Vr increases. The turn-on of the switch S1 at substantially zero voltage therefore may be obtained by synchronization with the inverter 110.

Then, at a first time t1, the switch S1 turns on. As the switch current I(S1) increases (due to a charging of a transformer leakage inductance), the current through the freewheeling diode Df gradually decreases. When the switch current I(S1) reaches the choke current I(L), the freewheeling diode Df should turn off. In high-voltage output applications, however, the freewheeling diode Df may conduct negative current for a period of time due to reverse recovery. Leakage inductance and reverse recovery energy that would otherwise be dissipated in conventional circuits may now be transferred through the clamping diode Dc and the clamping capacitor Cc for delivery to the output. A clamping capacitor current I(Cc) increases after reverse recovery to pick up the reverse recovery current (see FIG. 2C). Since a clamping voltage V(Cc) of the clamping capacitor Cc may be lower than the output voltage Vout, most of the reverse recovery energy may be directly transferred to the output. Additionally, the clamping capacitor Cc clamps a voltage of the freewheeling diode Df, thus reducing a noise associated with the reverse recovery of the freewheeling diode Df.

At a second time t2, the clamping capacitor current I(Cc) is discharged to substantially zero. The clamping capacitor current I(Cc) then reverses to maintain a charge balance of the clamping capacitor Cc. The following equation may represent the clamping capacitor current I(Cc):

$$I(Cc) = \frac{V(Cc) + Vout - Vr}{Rc}$$

Next, at a third time t3, the switch S1 is turned off. The clamping capacitor current I(Cc) increases as the secondary transformer current now flows through the clamping diode Dc and the clamping capacitor Cc, to the output. The clamping capacitor current I(Cc) then decreases as the leakage inductance of the transformer discharges.

Then, at a fourth time t4, the clamping capacitor current I(Cc) is reduced to substantially zero, causing the clamping diode Dc and the rectifier 130 to turn off. Since little, if any, voltage is imposed on either the clamping diode Dc or the rectifier 130 after turn-off, the reverse recovery condition may be avoided.

In the illustrated embodiment, the clamping resistor Rc is connected across the clamping diode Dc to maintain the charge balance of the clamping capacitor Cc. Of course, the clamping resistor Rc may be relocated without changing an overall operation of the snubber circuit 150.

Figure 3:
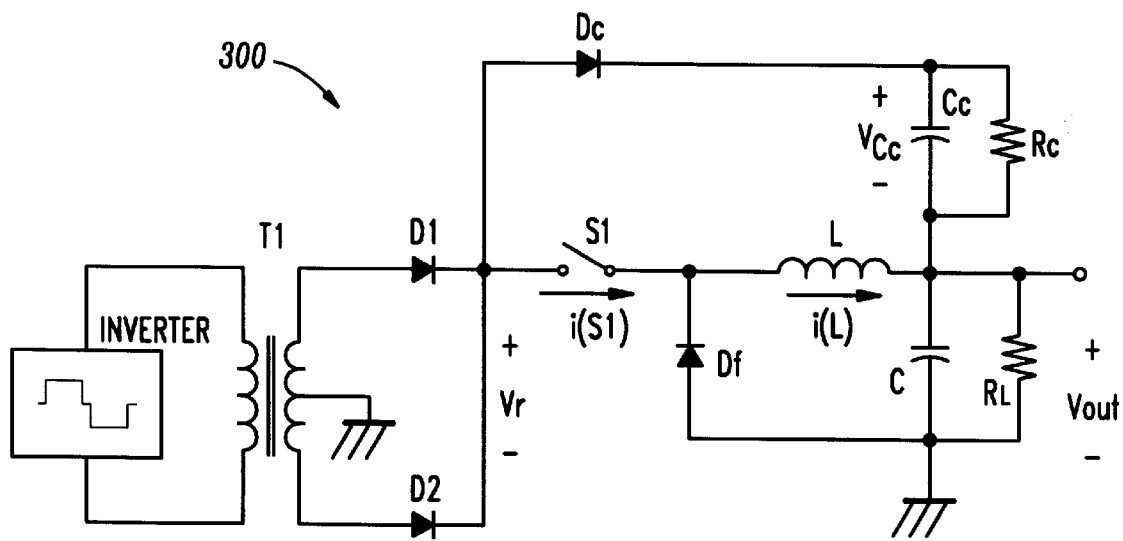
FIG. 3 illustrates a schematic diagram of another embodiment of a DC/DC power converter constructed according to the principles of the present invention.

Turning now to FIG. 3, illustrated is a schematic diagram of another embodiment of a DC/DC power converter 300 constructed according to the principles of the present invention. The power converter 300 is similar to the power converter 100 of FIG. 1 and, as a result, will not be described in detail. In the illustrated embodiment, the clamping resistor Rc is directly connected across the clamping capacitor Cc, rather than across the clamping diode Dc (as shown in FIG. 1).

Figure 4:
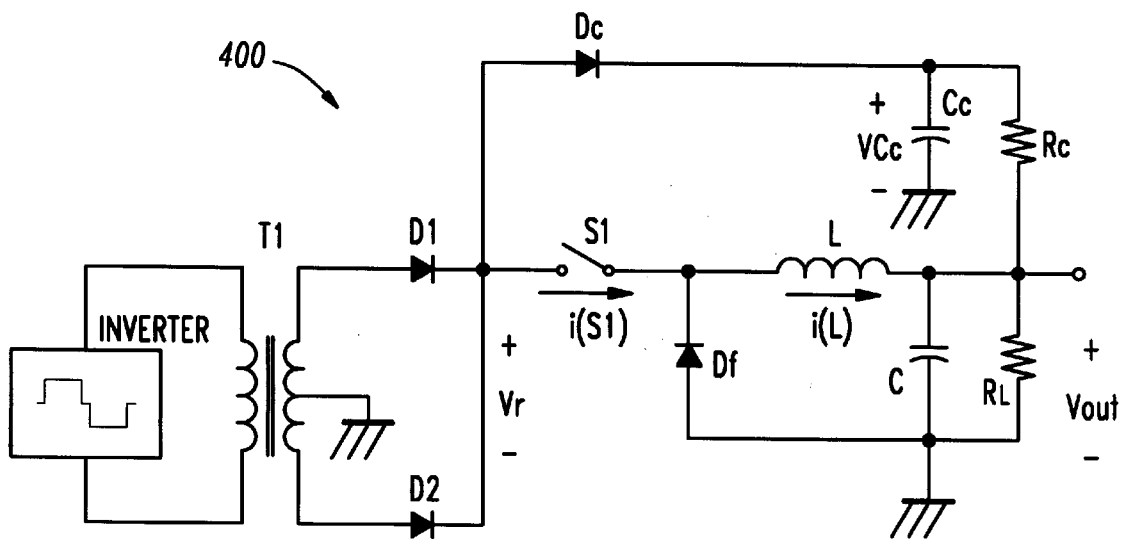
FIG. 4 illustrates a schematic diagram of another embodiment of a DC/DC power converter constructed according to the principles of the present invention.

Turning now to FIG. 4, illustrated is a schematic diagram of another embodiment of a DC/DC power converter 400 constructed according to the principles of the present invention. The power converter 400 is similar to the power converter 100 of FIG. 1 and, as a result, will not be described in detail. In the illustrated embodiment, the clamping capacitor Cc is directly connected to a ground of the output. The clamping capacitor Cc is thus closer to the switch S1 and may, therefore, more effectively clamp a voltage of the switch S1. Additionally, since the clamping capacitor Cc and its associated high peak current is not directly connected to the output, output noise may be reduced.

In the snubber circuits described above, the clamping resistor Rc maintains the charge balance of the clamping capacitor Cc. The presence of the clamping resistor Rc, however, results in some power loss. Since the clamping voltage V(Cc) may, for a number of applications, be lower than the output voltage Vout, most of the transformer leakage inductance energy is transferred to the output. A power loss of the clamping resistor Rc, therefore, may not be significant. For some applications, however, it may be desirable to reduce power loss even further.

Figure 5:
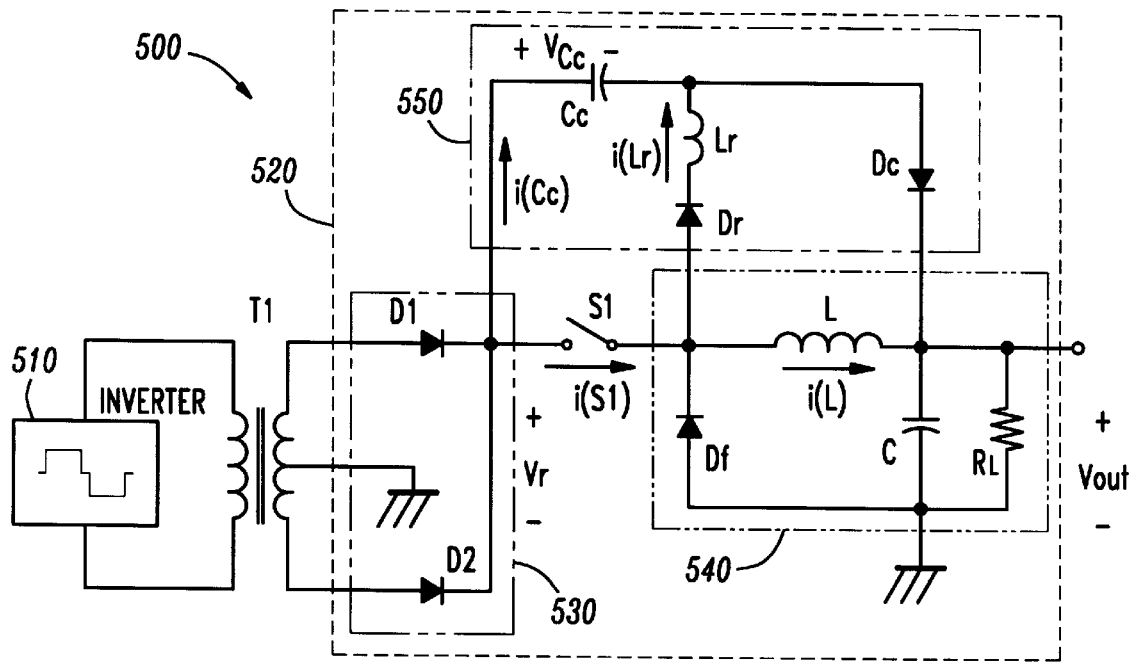
FIG. 5 illustrates a schematic diagram of another embodiment of a DC/DC power converter constructed according to the principles of the present invention.

Turning now to FIG. 5, illustrated is a schematic diagram of another embodiment of a DC/DC power converter 500 constructed according to the principles of the present invention. The power converter 500 includes a transformer T1 having primary and secondary windings. The power converter 500 further includes an inverter 510, coupled to the primary winding. The inverter 510 is well known in the art and will not be discussed further. The power converter 500 still further includes a post regulator 520, coupled to the secondary winding. An output of the power converter 500 provides an output voltage Vout to a load (not shown).

The post regulator 520 includes a rectifier circuit 530, coupled to the secondary winding. The post regulator 520 further includes a post regulating switch S1, series-coupled to the rectifier circuit 530. The post regulator 520 further includes an output circuit 540, consisting of a freewheeling diode Df, an output filter (containing an output inductor L and an output capacitor C), and a load resistor Rl. The output circuit 540 is coupled between the switch S1 and the output of the power converter 500. The rectifier circuit 530, switch S1, and output circuit 540 are similar to the rectifier circuit 130, switch S1, and output circuit 140 of FIG. 1 and, as a result, will not be described again in detail.

The post regulator 520 still further includes a snubber circuit 550, coupled between the rectifier circuit 530 and the output circuit 540. In the illustrated embodiment, the snubber circuit 550 contains a clamping capacitor Cc and a clamping diode Dc, series-coupled between the rectifier circuit 530 and the output circuit 540. The snubber circuit 550 further contains an inductor Lr and a diode Dr, parallel-coupled to the clamping diode Dc. The snubber circuit 550 thus uses the nondissipative inductor Lr to maintain a charge balance of the clamping capacitor Cc in place of the dissipative clamping resistor Rc of the snubber circuit 150 of FIG. 1.

The snubber circuit 550 operates as follows. When the switch S1 turns on, the clamping capacitor Cc charges energy into the inductor Lr to achieve charge balance. When the switch S1 turns off, the energy stored in the inductor Lr is delivered to the output through the clamping diode Dc. The diode Dr forces the current in the inductor Lr to be unidirectional. Additionally, the diode Dr may also reduce voltage ringing. Charge balancing of the clamping capacitor Cc may thus be performed without the use of dissipative components, resulting in increased efficiency. If fast transients are expected, however, some lossy components such as resistors or resistor-capacitor circuits may be added in series with the inductor Lr or the clamping diode Dc to dissipate a portion of the transient energy and to reduce the peak current delivered to the output.

Figure 6:
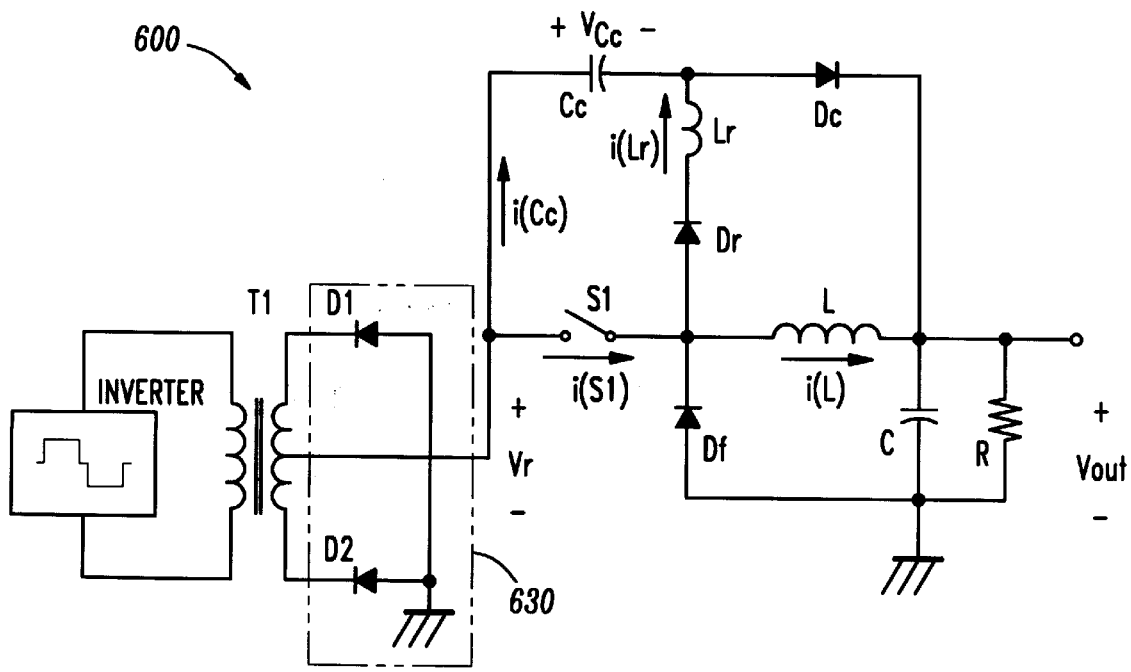
FIG. 6 illustrates a schematic diagram of another embodiment of a DC/DC power converter constructed according to the principles of the present invention.

Of course, the principles of the present invention may also be applied to different implementations of post regulators. Turning to FIG. 6, illustrated is a schematic diagram of another embodiment of a DC/DC power converter 600 constructed according to the principles of the present invention. The power converter 600 is similar to the power converter 500 but contains a modified full bridge rectifier circuit 630. The rectifier circuit 630 contains first and second rectifier diodes D1, D2, parallel coupled between opposing ends of the secondary winding and ground. An output of the rectifier circuit 630 is obtained from a point between the opposing ends of the secondary winding. The full bridge rectifier circuit 630 is familiar to those skilled in the art and will not be discussed further.

Figure 7:
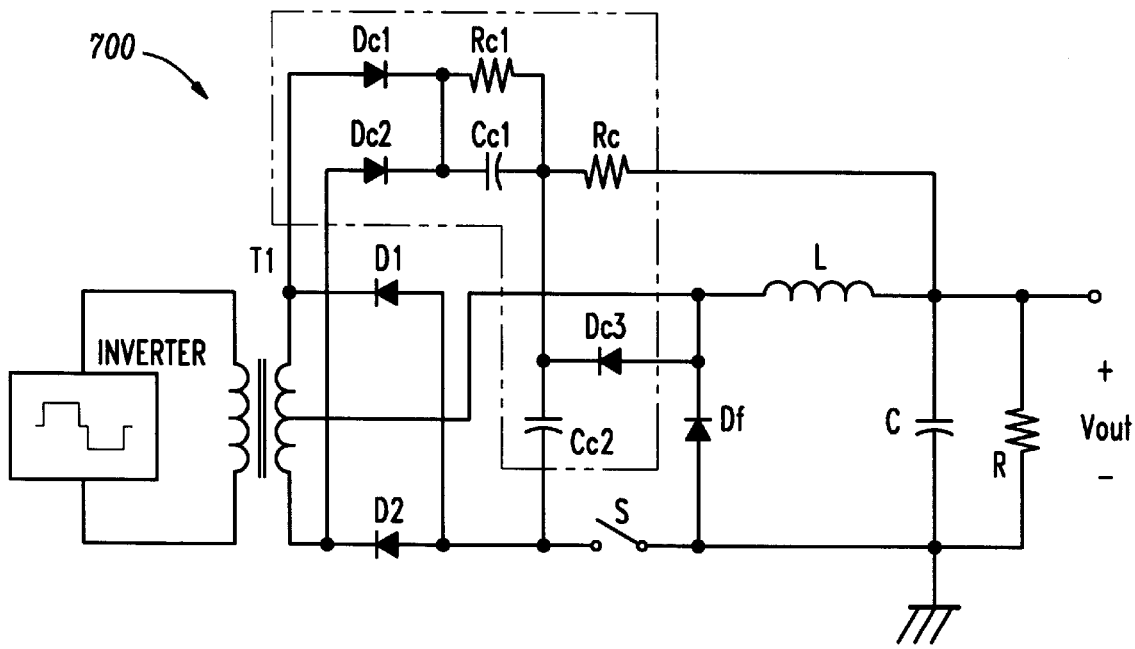
FIG. 7 illustrates a schematic diagram of another embodiment of a DC/DC power converter constructed according to the principles of the present invention.

Turning now to FIG. 7, illustrated is a schematic diagram of another embodiment of a DC/DC power converter 700 constructed according to the principles of the present invention. The power converter 700 is similar to the power converter 300 of FIG. 3 and, as a result, will not be described in detail. The illustrated embodiment employs first, second, and third clamping diodes Dc1, Dc2, Dc3. The first and second clamping diodes Dc1, Dc2 clamp voltages across the first and second rectifier diodes D1, D2, respectively. Energy associated with oscillation caused by transformer leakage inductance or diode reverse recovery may, therefore, be transferred to first and second clamping capacitors Cc1, Cc2. A portion of the energy delivered to the second clamping capacitor Cc2 may be fed into an output of the power converter 700. A clamping resistor Rc1 maintains a charge balance of the first clamping capacitor Cc1.

Figure 8:
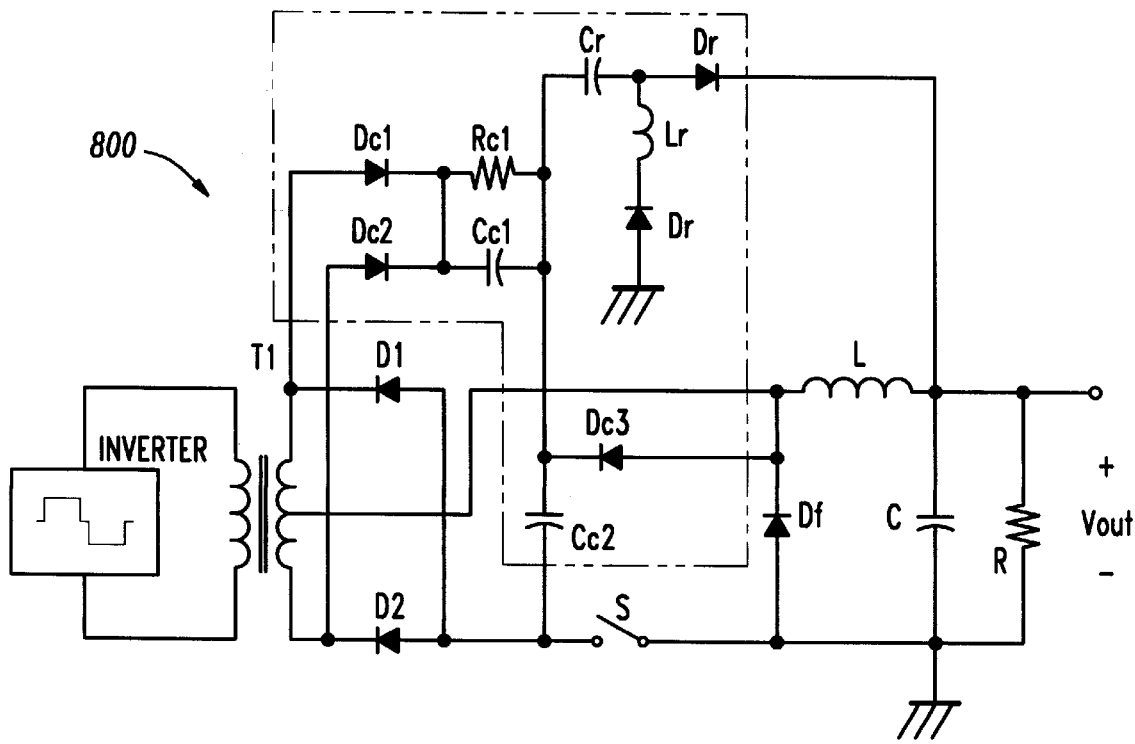
FIG. 8 illustrates a schematic diagram of yet another embodiment of a DC/DC power converter constructed according to the principles of the present invention.

Turning now to FIG. 8, illustrated is a schematic diagram of another embodiment of a DC/DC power converter 800 constructed according to the principles of the present invention. The power converter 800 is similar to the power converter 500 of FIG. 5 and, as a result, will not be described in detail. The illustrated embodiment combines the first, second, and third clamping diodes Dc1, Dc2, Dc3 of the power converter 700 of FIG. 7 with the nondissipative inductor Lr and diode Dr of the power converter 500 of FIG. 5. Energy associated with oscillation caused by transformer leakage inductance or diode reverse recovery may, therefore, be transferred to first and second clamping capacitors Cc1, Cc2. Additionally, the nondissipative inductor Lr and diode Dr allow a substantial portion of the energy delivered to the second clamping capacitor Cc2 to be fed into an output of the power converter 800.

For a better understanding of power electronics, including post regulators, see *Power Electronics: Converters, Applications and Design*, by N. Mohan, T. M. Undeland and W. P. Robbins, John Wiley & Sons Publishing Company (1989); and *Design Techniques for Synchronous-Switch Post Regulators*, by C. Jamerson and T. Long, published in *Proceedings of High Frequency Power Conference* (1993) and *Modeling and Design of Non-dissipative LC Snubber Networks*, by W. J. Shaughnessy, published in *Solid-State Power Conversion International Conference* (1980) incorporated herein by reference.

Although the present invention has been described in detail, those skilled in the art should understand that they can make various changes, substitutions and alterations herein without departing from the spirit and scope of the invention in its broadest form.

What is claimed is:

1. For use with a post regulator for a power converter, said post regulator having a rectifier circuit and an output circuit, an energy recovery snubber, comprising:

a clamping diode and a clamping capacitor, series-coupled between said rectifier circuit and said output circuit, that cooperate to recover reverse recovery energy developed in said power converter to an output thereof; and a charge balancing circuit, coupled to said clamping capacitor, that maintains a charge balance of said clamping capacitor.

2. The snubber as recited in claim 1 wherein said snubber is coupled to first and second rectifier diodes of said rectifier circuit.

3. The snubber as recited in claim 1 wherein said rectifier circuit is a full wave rectifier.

4. The snubber as recited in claim 1 wherein said post regulator further has a post regulating switch, series-coupled to said rectifier circuit, that switches to provide voltage regulation for said power converter.

5. The snubber as recited in claim 1 wherein said output circuit has a freewheeling diode and an output capacitor coupled to said freewheeling diode.

6. The snubber as recited in claim 1 wherein said charge balancing circuit comprises a clamping resistor parallel-coupled across said clamping diode.

7. The snubber as recited in claim 1 wherein said charge balancing circuit comprises an inductor and a diode coupled to said clamping capacitor.

8. For use with a post regulator for a power converter, said post regulator having a rectifier circuit and an output circuit, a method of recovering reverse recovery energy developed in said power converter to an output thereof, comprising the steps of:

conducting at least a portion of said reverse recovery energy through a clamping diode and a clamping capacitor series-coupled between said rectifier circuit and said output circuit; and maintaining a charge balance of said clamping capacitor with a charge balancing circuit coupled to said clamping capacitor.

9. The method as recited in claim 8 wherein said steps of conducting and maintaining are performed by a snubber, coupled to first and second rectifier diodes of said rectifier circuit.

10. The method as recited in claim 8 wherein said rectifier circuit is a full wave rectifier.

11. The method as recited in claim 8 further comprising the step of controlling a post regulating switch, series-coupled to said rectifier circuit, to provide voltage regulation for said power converter.

12. The method as recited in claim 8 wherein said output circuit has a freewheeling diode and an output capacitor coupled to said freewheeling diode.

13. The method as recited in claim 8 wherein said charge balancing circuit comprises a clamping resistor parallel-coupled across said clamping diode.

14. The method as recited in claim 8 wherein said charge balancing circuit comprises an inductor and a diode coupled to said clamping capacitor.

15. A power converter, comprising:

an inverter;

a transformer having a primary winding coupled to said inverter;

a post regulator, coupled to a secondary winding of said transformer, including:

a rectifier circuit that rectifies energy received from said secondary winding; and an output circuit, coupled to said rectifier circuit, that delivers said rectified energy to an output of said power converter; and an energy recovery snubber, including:

a clamping diode and a clamping capacitor, series-coupled between said rectifier circuit and said output circuit, that cooperate to recover reverse recovery energy developed in said power converter to said output; and a charge balancing circuit, coupled to said clamping capacitor, that maintains a charge balance of said clamping capacitor.

16. The power converter as recited in claim 15 wherein said snubber is coupled to first and second rectifier diodes of said rectifier circuit.

17. The power converter as recited in claim 15 wherein said rectifier circuit is a full wave rectifier.

18. The power converter as recited in claim 15 wherein said post regulator further has a post regulating switch, series-coupled to said rectifier circuit, that switches to provide voltage regulation for said power converter.

19. The power converter as recited in claim 15 wherein said output circuit has a freewheeling diode and an output capacitor coupled to said freewheeling diode.

20. The power converter as recited in claim 15 wherein said charge balancing circuit comprises a clamping resistor parallel-coupled across said clamping diode.

21. The power converter as recited in claim 15 wherein said charge balancing circuit comprises an inductor and a diode coupled to said clamping capacitor.

* * * * *